(12) United States Patent
Put et al.

(10) Patent No.: US 12,306,212 B2
(45) Date of Patent: May 20, 2025

(54) CONFORMAL DEPOSITION FOR HIGH VOLTAGE ISOLATION

(71) Applicant: Melexis Technologies SA, Bevaix (CH)

(72) Inventors: Brecht Put, Tessenderlo (BE); Tim Vangerven, Tessenderlo (BE)

(73) Assignee: MELEXIS TECHNOLOGIES SA, Bevaix (CH)

(*) Notice: Subject to any disclaimer, the term of this patent is extended or adjusted under 35 U.S.C. 154(b) by 149 days.

(21) Appl. No.: 18/058,437

(22) Filed: Nov. 23, 2022

(65) Prior Publication Data

US 2023/0160927 A1 May 25, 2023

(30) Foreign Application Priority Data

Nov. 25, 2021 (EP) .................................. 21210595

(51) Int. Cl.
  *G01R 15/20* (2006.01)
  *G01R 33/00* (2006.01)
  *G01R 33/07* (2006.01)

(52) U.S. Cl.
  CPC ....... *G01R 15/202* (2013.01); *G01R 33/0047* (2013.01); *G01R 33/0052* (2013.01); *G01R 33/072* (2013.01)

(58) Field of Classification Search
  CPC ........ G01R 15/00; G01R 15/14; G01R 15/18; G01R 15/20; G01R 15/202; G01R 33/00; G01R 33/0047; G01R 33/0052; G01R 33/02; G01R 33/06; G01R 33/07; G01R 15/207; G01R 33/072; C23C 16/00; C23C 16/22; C23C 16/30; C23C 16/40; C23C 16/44; C23C 16/455; C23C 16/45525

USPC .......................................................... 324/200
See application file for complete search history.

(56) References Cited

U.S. PATENT DOCUMENTS

| 3,829,883 | A | * | 8/1974 | Bate | ................ | H01L 29/82 257/589 |
| 5,583,436 | A | * | 12/1996 | Van De Walle | ....... | G01R 33/09 324/252 |
| 12,071,690 | B2 | * | 8/2024 | Han | .......... | C01G 15/00 |
| 2004/0150397 | A1 | * | 8/2004 | Kuroe | ................. | G01R 33/02 428/815 |
| 2011/0227560 | A1 |   | 9/2011 | Haratani et al. |   |   |
| 2016/0115612 | A1 | * | 4/2016 | Ikegawa | ............. | G11B 5/3123 205/122 |
| 2017/0115363 | A1 | * | 4/2017 | Jiang | ..................... | G01R 35/00 |

(Continued)

FOREIGN PATENT DOCUMENTS

| DE | 10017374 A1 | 12/2000 |
| DE | 10135428 C1 | 8/2002 |

OTHER PUBLICATIONS

Search Report from corresponding European Application No. 21210595. 1, May 18, 2022.

*Primary Examiner* — Hoai-An D. Nguyen
(74) *Attorney, Agent, or Firm* — Workman Nydegger (57) ABSTRACT

A method of manufacture of a sensor and a sensor for sensing a magnetic field generated by a current in a conductive substrate includes a first substrate having a sensing element for sensing magnetic field, and a second substrate is the conductive substrate. A conformal layer is provided by atomic layer deposition between the first substrate and the second substrate, thus protecting at least the sensing element from discharge from the second substrate.

15 Claims, 4 Drawing Sheets

(56) References Cited

U.S. PATENT DOCUMENTS

2020/0300898 A1  9/2020  Vangerven et al.
2022/0005498 A1* 1/2022  Le .......................... H10N 52/80

* cited by examiner

CONFORMAL DEPOSITION FOR HIGH VOLTAGE ISOLATION

FIELD OF THE INVENTION

The invention relates to the field of electronic circuits and manufacture thereof. More specifically it relates to electric insulation of electronic circuitry.

BACKGROUND OF THE INVENTION

Many industrial, domestic, and automotive applications handle high currents and high electric fields, while sensitive components require electric isolation. For example, charging stations manage voltages up to 800 V, and supercharger power outputs are in the range of 150 kW. There is a tendency to increase such power outputs, so the need for good insulation of sensitive electronic components and circuits will increase. Other examples of devices include antennas, HVAC systems, appliances, and domestic power generators. Applications in the automotive industry that benefit from insulation include on-board charges, DC/DC converters, electric motors, PTC-heaters, compressors, and the like.

These devices need to be compact devices, due to design and technological requirements. This requirement conflicts with the need of insulation, because the closer the components are, the higher the risk of discharge and damage of sensitive elements.

An example of devices are sensors which measure parameters related to electromagnetic field. These usually include components that need to be close to strong EM fields and/or currents. Integrated elements that detect, for instance, magnetic fields generated by a nearby current need to be close to the conductor of said current. The closer the sensing element is to the conductor, the more sensitive the sensor is, but the higher the risk of receiving a discharge from the conductor. Large potential difference may develop between the primary circuit and secondary circuit of an integrated sensor, from tens to hundreds of volts or even in the kV range. These potentials can lead to breakdown of the insulation in a single event, in case of dielectric breakdown, or during the lifetime of the device, by partial discharge. To prevent these issues from happening, existing current sensors include an isolation barrier including polyimide adhesive tape between a circuit connected to line voltage and a secondary circuit, thereby creating a protective isolation barrier between the circuits.

However, adhesion issues may arise. Discharge may be reduced or impeded through the tape; however, it may still occur around the tape. The presence of the adhesive tape may affect the sensitivity of the device. For these and other reasons, it would be desirable to improve the insulation of circuit elements to reduce electric breakdown, in particular for integrated circuits of sensors.

SUMMARY OF THE INVENTION

It is an object of embodiments of the present invention to provide an electronic circuit with effective electric isolation and high breakdown field, and manufacture thereof, particularly in the field of sensors such as current sensors.

In a first aspect, the present invention provides a method of manufacture of a sensor for sensing a magnetic field generated by a current in a conductive substrate. The method comprises providing a first substrate comprising a sensing element for sensing magnetic field, and providing a second, conductive, substrate. The method further comprises providing, by atomic layer deposition, an insulating layer between the first substrate and the second substrate. It is an advantage of embodiments of the present invention that the method provides a sensing element in a first substrate for sensing magnetic field caused by current through a second substrate, where the distance of between sensing element and the probe substrate can be accurately controlled while keeping good insulation thanks to the deposition. The second substrate may comprise a lead frame which should be insulated from the semiconductor substrate and from any leads connected to said substrate. It is an advantage of embodiments that ALD is based on a self-limiting reaction, allowing filling of trenches and/or gaps gradually without clogging them, thus improving insulation.

In some embodiments of the present invention, providing an insulating layer comprises providing a conformal insulating layer. It is an advantage of embodiments of the present invention that the method provides a sensor with less or no uncoated gaps, by providing conformal coating of at least the first substrate (e.g., semiconductor substrate) and/or the second substrate (e.g., conductive substrate or probe). These layers allow covering surfaces of trenches and gaps, optionally filling them up with insulating material, without clogging the opening of the gap even for gaps with high aspect ratio. Since there is no clogging, it is ensured that insulating material is deposited in the inner surfaces of the substrate or substrates delimiting the gap.

In some embodiments of the present invention, providing an insulating layer comprises providing a metal oxide by deposition, optionally providing aluminum oxide.

It is an advantage of embodiments of the present invention that the insulating layer can be easily provided by ALD, and it has a high breakdown voltage, for example in the case the metal oxide is alumina, allowing the provision of thin layers thereby allowing the substrates (the sensing element and the lead frame) to be placed at a distance low enough to provide high sensitivity without risking breakdown.

In some embodiments of the present invention, providing an insulating layer by atomic layer deposition comprises depositing an insulating layer over the first substrate or the second substrate. In particular embodiments, the insulating layer is provided on one substrate or on each substrate separately. It is an advantage of embodiments of the present invention that the conformal layer can be provided during at any stage of the manufacturing process before assembly of the components, for example at wafer level or over the lead frame.

In particular embodiments, providing a first and second substrate comprises providing at least one substrate with at least two non-coplanar adjacent surfaces, and wherein providing an insulating layer comprises providing an insulating layer over the at least one substrate on said at least two non-coplanar adjacent surfaces.

In some embodiments of the present invention, the method further comprises assembling the first and second substrates, thereby providing a package before providing the insulating layer by atomic layer deposition, subsequently depositing the insulating layer by atomic layer deposition over both substrates and subsequently molding the package thereby forming a molded package. It is an advantage of embodiments of the present invention that the insulating layer can be provided easily on assembled substrates simultaneously, for example after reflow.

In some embodiments of the present invention, the method further comprises providing a buffer interlayer for buffering stress between the insulating layer and the underlying substrate.

It is an advantage of embodiments of the present invention that the thermal stresses, which may occur during manufacture and during lifetime of the device, are reduced or minimized. In particular embodiments, the insulating layer has a coefficient of thermal expansion of a predetermined first value, the substrate over which the insulating layer is deposited has a coefficient of thermal expansion of a predetermined second value, and the further buffer interlayer has a coefficient of thermal expansion of a value between the predetermined first value and the predetermined second value.

These contributions of CTE mismatch to the stresses can be reduced or minimized.

It is a further advantage that the adhesion of the substrate to the insulating layer can be improved.

In some embodiments of the present invention, providing a buffer interlayer comprises providing an organic-inorganic hybrid polymer by molecular layer deposition.

It is an advantage of embodiments of the present invention that the further layer is also a conformal layer, so there is no direct contact between the insulating layer and the underlaying substrate, improving thermomechanical characteristics.

In some embodiments of the present invention, providing the insulating layer by atomic layer deposition comprises providing spatial atomic layer deposition. It is an advantage of embodiments of the present invention that the insulating layer can be provided faster.

In a second aspect, the present invention provides a sensor comprising a first substrate comprising a sensing element, and a second substrate being a conductive substrate adapted to generate a measurable magnetic field upon connecting the second substrate to a current flow. The sensing element is arranged to sense a magnetic field generated by the second substrate. The sensor comprises a conformal insulating layer between the first substrate and the second substrate.

It is an advantage of embodiments of the present invention that dielectric breakdown and partial discharge are reduced by insulation of sensitive elements from high voltages.

In some embodiments of the present invention, the insulating layer has a thickness between 1 micron and 100 microns. It is an advantage of embodiments of the present invention that dielectric breakdown and partial discharge are reduced by insulation of sensitive elements from high voltages.

In some embodiments of the present invention, the insulating layer comprises a metal oxide. It is an advantage of embodiments of the present invention that metal oxide can be provided conformally via ALD. It is a further advantage that high breakdown voltages can be obtained. For example, in the case the metal oxide is alumina, the sensing element and the primary lead frame (acting as a probe) can be placed very close to each other thereby providing high sensitivity without risking breakdown.

In some embodiments of the present invention, the insulating layer is provided at least on the first and second substrates. It is an advantage of embodiments of the present invention that, thanks to the conformality of the layers, there is no gap left without insulation layer between the different substrates.

In some embodiments of the present invention, the sensor further comprises a buffer interlayer between the insulating layer and at least one of the substrates, for buffering stresses between the insulating layer and the underlying substrate. It is an advantage of embodiments of the present invention that the interlayer improves adhesion of the insulating layer and reduces stresses caused by, among other reasons, CTE mismatch. In particular embodiments, the insulating layer has a coefficient of thermal expansion of a predetermined first value, the substrate including the insulating layer has a coefficient of thermal expansion of a predetermined second value, and the further interlayer has a coefficient of thermal expansion of a value between the predetermined first value and the predetermined second value.

In particular embodiments, the buffer interlayer comprises a conformal organic-inorganic hybrid polymer. It is an advantage that the elasticity of the polymer improves stress relief.

In some embodiments of the present invention, the sensor further comprises a third substrate electrically connected to the first substrate, for redirecting measurement signals generated by the sensing element to an external output, further comprising an insulating layer between the third substrate and at least second substrate.

It is an advantage of embodiments of the present invention that the signal leads are ensured a proper insulation from the probe.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The dimensions and the relative dimensions do not correspond to actual reductions to practice of the invention.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some, but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "measurement signals", reference is made to electric signals generated by a sensing element. The magnitude of these signals is proportional to the value of the parameter affecting the sensing element. Usually, the generated signals are redirected out of the sensing element, for example through electrical contacts, vias, etc. to an output which usually lead to a processor for further signal processing, a memory, and/or display.

Where in embodiments of the present invention reference is made to "first substrate", reference is made to the substrate serving as support to electronics. It may be the support of a sensing element or in general of sensing circuitry. It may include an integrated circuit.

Where in embodiments of the present invention reference is made to "second substrate", reference is made to a conductive substrate which can carry currents. For example, it may be connectable to a power line or the like. For example, it may be a primary lead of a current sensor, where the conductive substrate carries the current to be measured. The conductive substrate may be for example a primary current conductor, where the conductor concentrates the magnetic field to enhance sensing by a sensing element. The primary current conductor may for example be a loop, may have a U-shape, the present invention not being limited to any particular shape. In some embodiments of the present invention, the current conductor has a reduced cross-section in the vicinity of the sensing element such as to enhance the current density and the generated magnetic field.

Where in embodiments of the present invention reference is made to "third substrate", reference is made to a signal transmitting conductor which is adapted to carry signals from a sensing element. It may be a secondary lead frame (or leads), which can be connected to an output for signal treatment and measurement readout.

Where in embodiments of the present invention reference is made to "conformal layer" reference is made to a layer that follows the shape and topography of the overlying substrate. A non-conformal coating layer on a flat substrate usually presents the layer on the large areas of the main surfaces, and the surfaces in the thickness direction (the faces of the substrate with smaller areas, such as the edges of the flat substrate) may present traces of the coating layer, with irregular coating. By contrast, a conformal layer can envelop a flat substrate, where several sides of the substrate can be coated by substantially the same thickness of material. For example, each surface of a substrate may be covered by a layer of substantially the same thickness, thus completely wrapping the substrate, for example the layer may be present on a main surface and one or more side surfaces, optionally also covering partially or totally the surface of the opposite side of the main surface. The layers have substantially the same thickness.

Conformal layers are obtained by layer deposition, such as ALD which is a self-limiting technique that is able to cover completely inner surfaces of trenches or gaps (instead of clogging them near the top or at the opening of the gap, as usually happens with CVD). Layer deposition also can provide homogeneous thickness within inner surfaces of gaps, and in more than one side (e.g., a main side and lateral sides, optionally also opposite side of the main side) of overhanging structures, while for example sputtering only provides material on the surface facing the sputtering target. Conformal layers can wrap a substrate completely. In particular, a ratio can be defined relative to a conformal layer, by the depth of coating within a trench or gap relative to the gap width.

The present invention relates to electronic devices, in particular to current sensors including one or more sensing elements and a current carrier, and manufacture of these current sensors. The current to be sensed is introduced in the sensor via the current carrier, which is usually a substrate made of conducting material. Typically, the substrate includes leads or a lead frame, and it receives the name of 'primary lead'. The magnetic field caused by a current in the current carrier is sensed by the one or more sensing elements. Due to the nature of the magnetic field, it is desirable to place the sensing element as close to the current carrier as possible, so the sensitivity of the sensor is high. Thus, two general 'sides' can be distinguished in a sensor, namely the 'primary side', which carries the signals to be sensed (e.g., currents) and the 'secondary side' which handles measurement signals, for signal processing and providing a reading. The secondary side usually includes delicate processing means, so the signals of the primary side provide reading by induction, magnetism or the like, as direct interaction of the signals of the primary side with the components of the secondary side may result in damage to the latter. For example, there is risk of damage to the sensing element or related circuitry in case of discharge, which is a serious possibility due to the potentially high currents through the current carrier in the primary side. Discharge may occur between two components of the sensor if the electric potential difference between these two components surpasses a breakdown potential threshold, also known as breakdown field $E_{BD}$, which depends on the material present between the two components.

It is noted that while the breakdown field is the electric field intensity at which the material can become at least temporarily conductive, the breakdown voltage is a device property related to the breakdown field. An improved breakdown field translates to a better breakdown voltage and thus a more resilient device.

Figure 1:
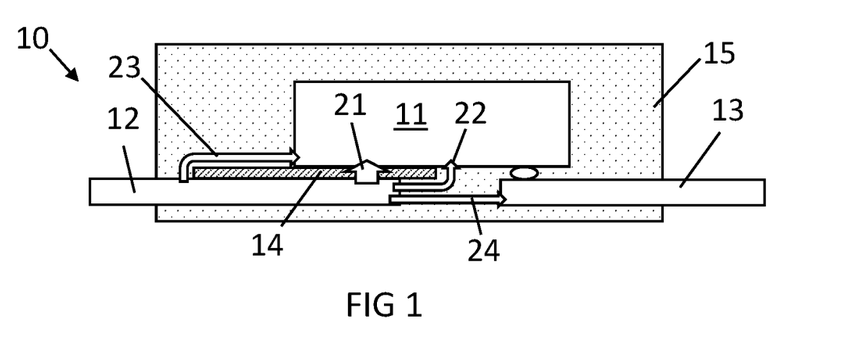
FIG. 1 and FIG. 2 illustrate a side and top sections respectively of a prior art current sensor which provides insulation between the probe current and the chip by a tape.
Figure 2:
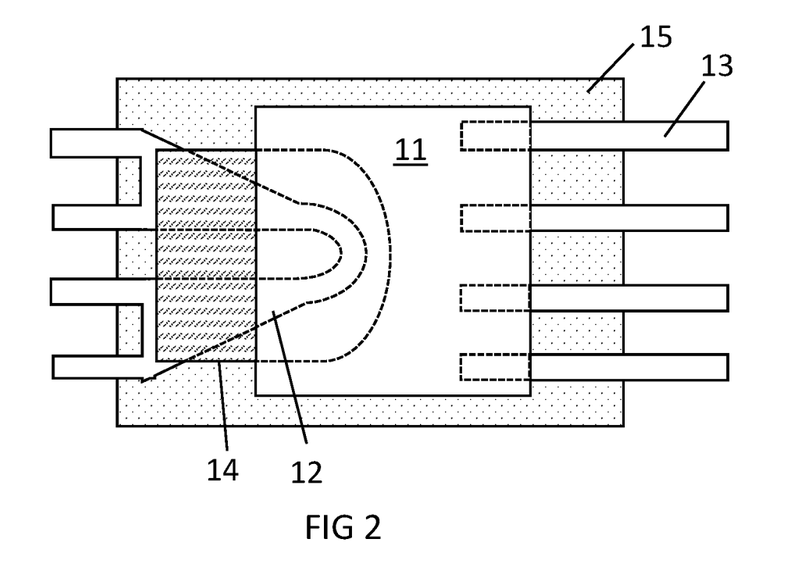

FIG. 1 shows a lateral section of an exemplary device 10 including a die 11 with an integrated circuit (IC) which generates measurement signals from the magnetic field generated by a primary lead 12. The device includes the primary lead 12 which can be connected to a line whose current is to be probed, and a secondary lead 13 which is electrically connected to the die 11 for carrying signals from the IC to an output. The leads stick out of the package 15 so they can be connected to external devices, for current input and for output of measurement signals. FIG. 2 shows a top view of the same exemplary device 10. Typically, adhesive tape 14 is introduced in the device 10, for example glued to the die 11 or to the lead 12, to protect the sensitive components from discharges. Different discharge paths are schematically represented by arrow paths 21, 22, 23, 24. The path 21 of a discharge through the tape 14 is prevented by the insulating nature of the material of the tape. $E_{BD}$ is determined by the materials forming the adhesive tape (usually polyimide and glue). Although the shortest path 21 is blocked by the tape, as long as the tape keeps its integrity, the voltage difference between the primary side and the secondary side (for example, the voltage difference between the primary lead 12 and secondary lead 13) should be limited so it does not surpass the $E_{BD}$ of the tape 14. However, discharge paths 22, 23 around the tape between the primary and secondary side are possible. In order to reduce this risk, usually the tape overhangs, extending the area covered by the tape beyond the overlapping area between the die 11 and the primary lead 12. This increases the effective distance that the discharge path 22, 23 needs to overcome to reach the integrated circuit in the die 11 from the primary lead 12. The total $E_{BD}$ depends on the tape 14 and any material surrounding the die 11 and the primary lead 12 (such as mold or the like). The type of tape, overhanging area, etc. are chosen accordingly with the particular current sensor, expected current ranges to be used, etc.

Aside of the limitations of design and the possibility of discharge around the tape, the solution does not provide protection of other components in the second side, such as connections and/or secondary leads 13. A direct discharge path 24 from the primary lead 11 to the secondary lead 12 is also possible. The chances are lowered and usually prevented by setting the leads 11, 12 apart by as much distance as possible. Usually, the design rating provides protection up to 6.6 kV DC. However, this limits the design and compactness of the device. The thickness of the adhesive tape 12 (which usually include several layers such as glue and polyimide) are additional design limitation factors. The adhesive tape 14 may degrade with time, potentially changing the detection characteristics, and eventually failing to properly insulate (so a short discharge path 21 may occur if the adhesive tape 14 degrades too much).

The present invention obtains improved performance by switching to a material with a higher breakdown field (compared to the tape and/or the glue) which allows to use a thinner insulation layer and thus to an increased sensitivity of the sensor. The secondary side is well protected from the currents of the primary side, without degradation issues. For example, the Hall plates and the primary current conductor can be brought closer together. Insulating layer thickness can be controlled with extreme accuracy using atomic layer deposition (ALD). In some embodiments, the insulation leaves no open path for discharge. In some embodiments, the insulation can be provided as a conformal layer, as such layer can be present on most or every surface between sensitive substrates and conductors, 'wrapping' the conductor and/or the sensitive material. This improves the voltage breakdown of the device. The present invention allows a conformal layer with a ratio of 100, for example the insulating coating may have an aspect ratio of 100 or larger than 100 when applied as a conformal layer by ALD. This means that the surfaces separated by a predetermined gap can be conformally covered to a depth 100 times larger, or more, than the gap.

In a first aspect of the present invention, a method is provided including providing a sensing element in a first substrate and providing a second, conductive, substrate. The method includes providing atomic layer deposition (ALD) to provide an insulating layer between at least the first and second substrates, thus improving electrical insulation between the primary side and the secondary side of the sensing element. This can provide electric isolation up to the range of kV, for example 10 kV. For example, the breakdown field of the manufactured device may reach 5 MV/cm, and surpass such values. ALD can be performed as part of the manufacture workflow of semiconductors, including integrated sensors, since current uses of ALD include CMOS and DRAM processing, as well as solar cell technology. This saves time and reduces chances of introducing impurities such dust.

Figure 3:
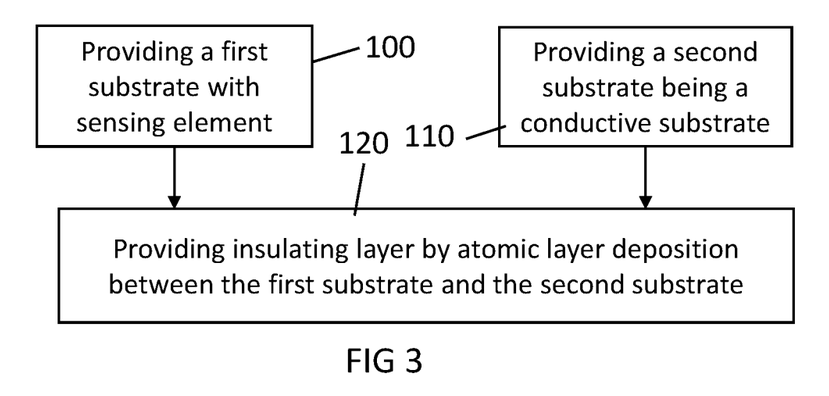
FIG. 3 shows schematically a manufacturing method in accordance with embodiments of the present invention.

FIG. 3 shows steps of the method in accordance with embodiments of the present invention, including optional steps. Providing the first substrate 100 with a sensing element may comprise providing for example a semiconductor substrate, e.g., a silicon die, and providing thereon e.g., one or more of a Hall elements, a magneto-resistive (MR) element, etc. Providing 110 the second substrate may comprise providing a conductive substrate, for example a primary lead, e.g., a primary current conductor, including providing means to connect to an external line, for probing a current.

The method includes providing 120 an insulating layer by atomic layer deposition between the first substrate and the second substrate, for example between the sensing element and the second substrate. This can be done in different ways, explained in the following, the present invention not being limited thereto.

The method may comprise positioning the second substrate relative to the first substrate so as to maximize magnetic field sensing. Because the insulation is improved with a thin conformal layer, the minimum distance required to avoid discharge can be reduced as compared to the prior art solutions such as the solutions including e.g., tape. This can improve sensitivity, for example a sensor obtained in accordance with embodiments of the present invention may present a sensitivity 33% higher than that of a sensor with adhesive tape as insulator, for approximately the same insulation.

In some embodiments, the method is provided during wafer level processing, including providing the insulating layer on the first substrate. The method may comprise partially processing the die so that the sidewalls of the final separated substrate can be advantageously at least partially coated by the conformal layer, e.g., simultaneously. For example, the method may comprise providing any required circuitry, e.g., an IC. It may comprise providing electrical connections on the first substrate for transmitting signals generated in the sensing element. Providing electrical connections can be done in any suitable way, e.g., by providing metallization layer, e.g., redistribution layer (RDL), under-bump metallization, studs, etc. The method may comprise providing any suitable passivation layer. Providing the insulating layer may comprise depositing insulating material by ALD on the first substrate, including depositing insulating material at least on the sensing elements. This means that, in some embodiments, the sensing elements such as Hall elements are covered by alumina. Providing the insulating layer may be done optionally over a surface of the first substrate, e.g., the surface including the sensing elements, optionally over the whole external surface of the substrate. The method may comprise subsequently providing electrical contacts through the insulating layer. For example, in some embodiments, sequential steps can be performed as shown in FIG. 4, although alternative or additional steps could also be performed.

Figure 4:
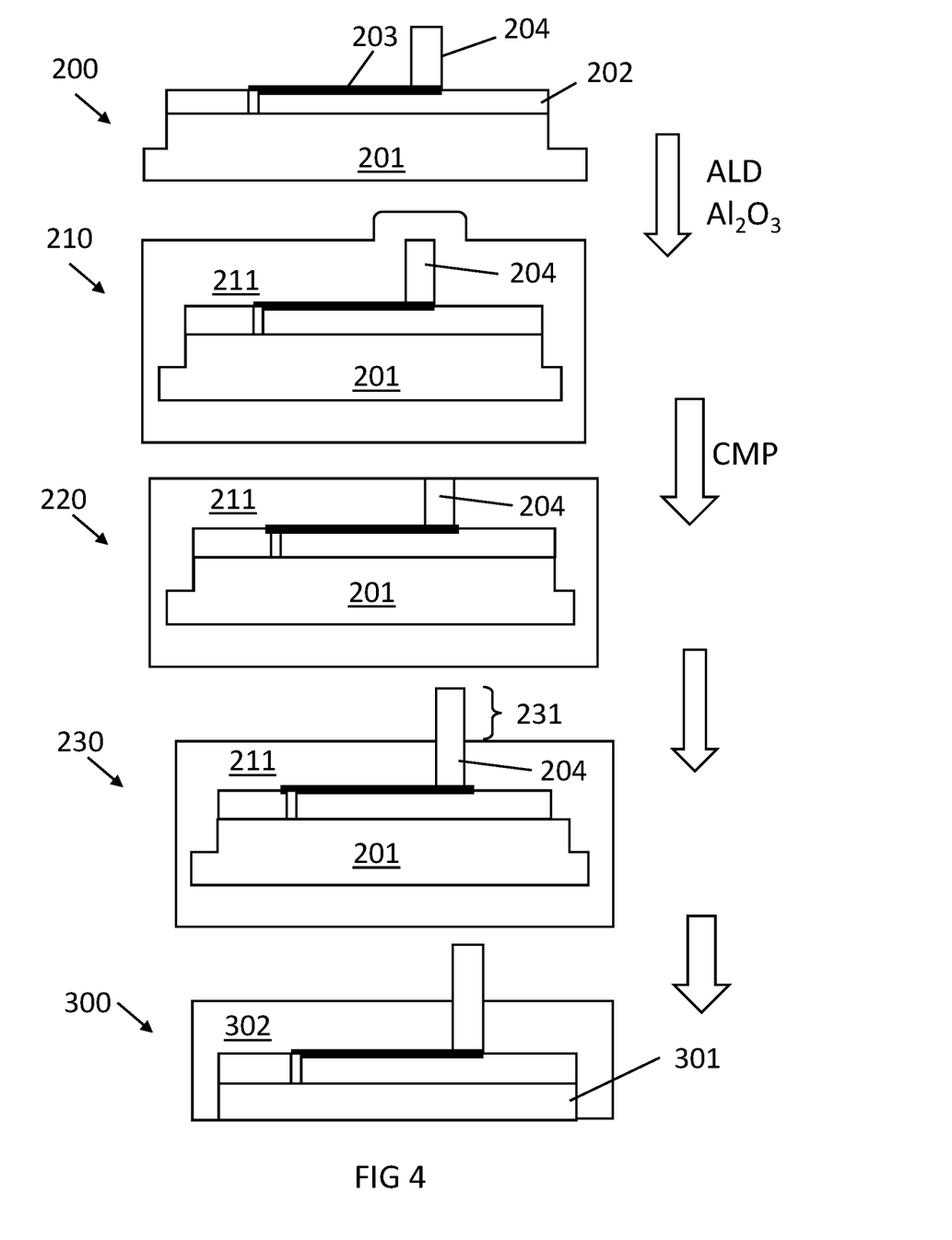
FIG. 4 shows different stages of a chip obtained during part of a sequence of manufacturing steps in accordance with embodiments of the present invention.

The specific sequence shown in FIG. 4 starts in a first step showing a first product 200 with a first substrate as part of a partially sawn wafer 201, a passivation layer 202 on one surface of the substrate and electric contacts of the IC. The electric contact may include e.g., a RDL 203 and Cu studs 204. The at least one sensing element is also provided as part of the first substrate (not pictured).

The first substrate is covered with insulating material 211 by ALD, as shown in the second product 210 of the following step of the sequence. In some embodiments, not shown, masking can be used, so the electric contacts are not covered by insulating material. The method may comprise removing the mask for providing later any required the electric contact. In the embodiment shown in the figure, ALD is performed over the surfaces of the partially sawn substrate 201 including the contacts formed by the Cu studs 204. It is necessary to remove insulating material to make the contacts accessible, for example by removal of selected areas of insulating layer. For example, in embodiments where the insulating layer is a conformal layer as shown in FIG. 4, the layer follows a contact standing out from the surface (such as the stud 204). The electric contact can be revealed by e.g., planarizing the surface. For example, this can be done by chemical-mechanical planarization (CMP), obtaining the third product 220. In some embodiments of the present invention, an optional step of plating can be performed. For example, Cu stud 231 can be provided on the electric contacts as shown in the fourth product 230 obtained as a result of that optional step.

Finally, the last step may comprise full sawing and optionally removal of excess of insulating materials, for example removing insulating layer from those areas of the semiconductor where there is no risk that a discharge path can be formed. This can include optionally back-grinding. A first substrate 301 (optionally including a passivation layer 202 as shown before), including sensing element, is thus covered by an insulating layer 302 (except on the electrical contacts and on the back surface of the die), where the insulating layer was provided by ALD. Such component 300, namely an insulated first substrate 300, is ready to be connected to a further substrate, e.g., to secondary leads, for example by flip-chip bonding techniques (the present invention not being limited thereto).

The second substrate, e.g., a primary lead, can be positioned relative to the insulated substrate in order to maximize the signal to be detected, without relatively thick barriers such as tapes. The components can be packaged with the rest of the components, thereby obtaining a packaged sensor.

In some embodiments, the method comprises interposing the insulating layer between the first substrate and the second substrate by depositing, using ALD, insulating material over the second substrate. The method may comprise coating only the primary lead frame or primary leads, thus providing LF coating. The coating can advantageously cover the surface of the second substrate on the region proximal to the first substrate. The region distal to the first substrate may be used to connect to a line or in general any source of current to be measured. This distal region should be free of insulating layer, either by removing the layer after deposition or preferably by protecting the region before providing ALD, so it is not coated. Thus, the method may include a step for providing an insulating layer on the second substrate, covering the proximal region to the components to be protected, without covering the region for providing electrical contact to a current to be probed. Protecting these distal areas can be advantageously easy. For example, they can be protected by selective deposition, masking the second substrate in an easy way by e.g., tape on the connections distal from the first substrate, etc.

The insulating layer may be provided between at least the sensing element and the conductive probe substrate, preferably in a larger surface so as to increase the discharge path from the second substrate to the first substrate as explained with reference to the prior art example of FIG. 1, and thus reduce the risk of discharge.

In some embodiments, the method includes providing insulating layer over at least two non-coplanar surfaces of a substrate, for example two non-coplanar adjacent surfaces, e.g., two perpendicular surfaces, of the first substrate and/or of the second substrate.

Figure 5:
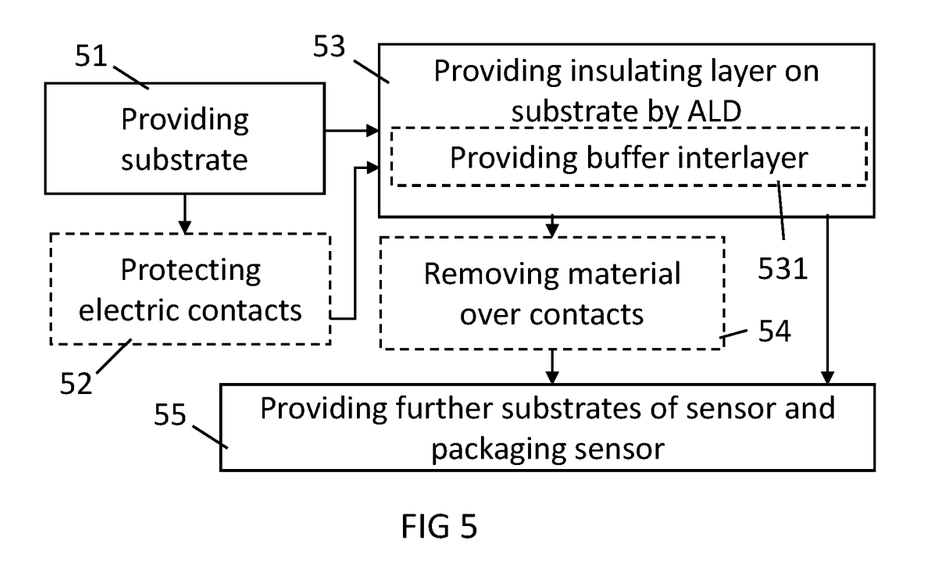
FIG. 5 and FIG. 6 show alternative manufacturing steps in accordance with embodiments of the present invention.

Some alternative methods of providing insulating layer at wafer-level processing or on the second substrate (e.g. the primary leads) can be seen schematically in FIG. 5, where the method includes providing 51 a substrate (e.g. a first and/or a second substrate), optionally protecting 52 the electric contacts in the substrate as explained earlier, subsequently depositing 53 insulating layer on the substrate by ALD, optionally revealing the contacts by removing 54 any material over contacts (especially if they were not protected before applying ALD), e.g. removing insulating material and material from any interlayer, and finally providing 55 the other substrates and packaging the sensor. It is noted that this method can be applied to both the first and second substrates. For example, the die with the IC and the primary lead can be at least partially covered by the insulating layer (e.g., alumina).

The method is not limited to deposition over substrates separately, such as the wafer-level coating or LF coating discussed before with reference to FIG. 4 and FIG. 5. The method can be applied to the assembled components. The method may follow the scheme shown in FIG. 6, which entails gathering the components of the device, e.g., the first and second substrate, and providing 61 electric connections where required (e.g., by providing a third substrate and connecting it to the first substrate), providing 62 the second substrate and assembling the device, and providing 63 the insulating layer over the assembled device.

Figure 6:
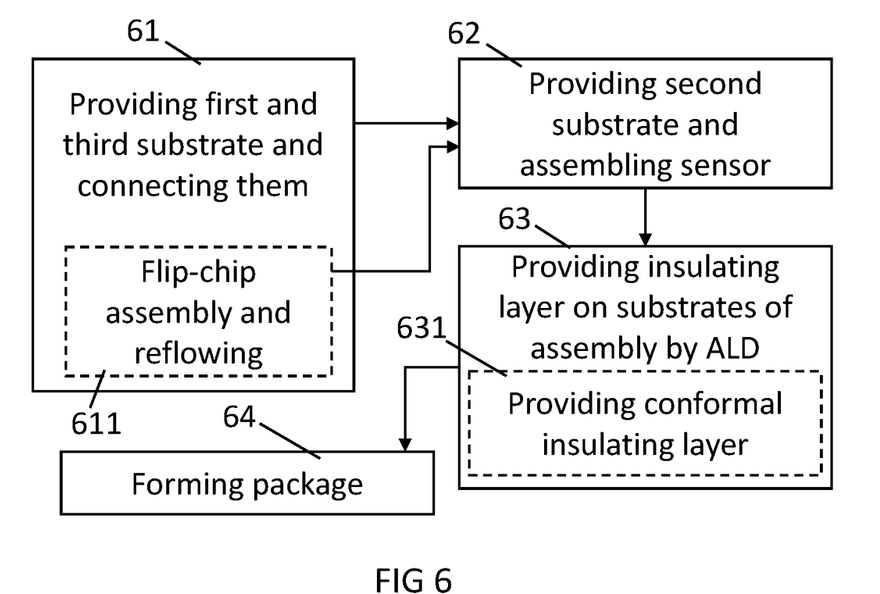

This deposition can follow the surfaces of the device and gaps between substrates, not only on the largest surfaces. The insulating layer may have substantially the same characteristics (e.g., same thickness) for these surfaces, thus providing 631 a conformal insulating layer. A packaged sensor can be obtained 64 (e.g., by molding the assembled device).

Since internal electrical connections are made where required before providing the insulating layer, there is no risk of blocking the contacts and having to perform an extra step (e.g., by use masking or opening the contacts again by planarization) thus speeding up the process. External contacts of the second and optionally third substrate should be not covered by insulating layer. These external contacts may be contacts of the primary lead frame to an external line for probing the current and contacts of the secondary lead frame to an output. They are usually at a distal position away from the first substrate. As explained with reference to the protection of connections of the second substrate, protecting the contacts of the second and third substrates can be done easily, e.g., by providing tape on lead contacts distal from the semiconductor substrate.

In some embodiments, the method is applied as part of flip-chip manufacturing process. For example, the deposition of the insulating material can be performed after providing 611 the connection between the substrate and the secondary frame by flip-chip manufacturing means, e.g., after reflow soldering. It is an advantage that manufacture speeds can be reduced, for example the speed can be reduced by half or more, compared to insulation of single substrates. However, the present invention is not necessarily limited to providing the layer after reflow.

In some embodiments, the method includes providing metal oxide by ALD as insulating material, e.g., alumina. However, the present invention is not limited to metal oxides, and other insulating materials can be used, such as nitrides or the like, e.g., silicon nitride. Other materials can be used, for example materials with high breakdown field like $Si_3N_X$, $MgF_2$, $Al_2O_3$, $ZrO_2$, $HfO_2$, e.g., materials with a large bandgap which usually show correspondingly high breakdown field.

The ALD can be performed with multiple cycles of deposition, including a first half cycle wherein a precursor is provided, followed by purge of excess reaction products, and a second half cycle where a co-reactant is provided, followed by purge of excess reaction products. The ALD may be a multi-precursor process, e.g., a process with 2 or 3 precursors, or even adding a plasma step (plasma enhanced ALD).

Typically, ALD is a slow process, as it entails deposition of layers with thickness in the order of atoms. The rate is few angstroms per minute, so in order to provide a thickness large enough to give the desired insulating effect, several minutes and even hours may be required.

In some embodiments of the present invention, the method may comprise providing spatial ALD, which shows deposition rate in the order of hundred times faster than standard ALD. In spatial ALD, there is a relative motion of the substrate through areas where different reactants are injected, and the reaction areas are separated from each other by bearings or gas curtains. For example, the removal (purging) of a reactant may be performed by a gas curtain or by driving the substrate to a pumping zone before that substrate area reaches the flow of the next reactant. Deposition rates may reach 10 nm thickness per minute.

In some embodiments of the present invention, a chip can be provided in 16 hours with an insulation of up to 10 kV if the substrate or substrates are insulated independently (wafer level or LF insulation), in particular when insulated by spatial ALD. This time can be reduced, even halved to 8 hours when providing the insulation after assembly (after electrically connecting the first and third substrates, e.g., after flip-chip and reflow), by spatial ALD.

In some embodiments, the method is carried out in a batch system, providing insulation to sets of hundreds of sensors at once, depending on the size of the batch system. As the method can be carried out in batches, several sensors can be provided simultaneously, for example in 8 hours.

In some embodiments, the deposition temperatures may be lower than 300 degrees, or even lower than 100 degrees. These temperatures are relatively low and safe for the manufacture of integrated circuits.

In some embodiments the method may comprise conformal deposition of the insulating layer. This allows providing the components close to each other during assembly, without risk of leaving regions without insulation, because any gap between the first and second substrate includes the insulating barrier interlaid between the substrates. If coating after reflowing, for example, gaps between the first and second substrate include the insulating layer, and even potentially between the second and third substate (e.g., between the primary lead and secondary lead). The method of coating after reflow or coating the second substrate (e.g., the lead frame) have the advantage that the third substrate can be laid out closer to the second substrate. Conformal deposition can be performed on a single substrate or on the whole assembly before molding, advantageously covering the surfaces of the gaps between different substrates.

In some embodiments, providing an insulating layer between the first and second substrates comprises providing a layer of insulating material with a thickness of 1 to 100 microns, for example 10 to 20 microns, for example around 15 microns.

In some embodiments of the present invention, the method comprises selective deposition in some areas of a substrate or of the assembled device. This can be done to preserve areas of electrical contact with no insulating layer, as explained earlier.

Additionally, or alternatively, the method of selective deposition may be adapted to reduce thermal stresses on the substrate on which the insulation is deposited. Since ALD requires cooling, or even intermittent cooling steps, the components may be subject to expansion or contraction due to the temperature changes. Mismatch in coefficient of thermal expansion (CTE) between the deposited material and the substrate may generate stresses.

For example, CTE of metals suitable for microelectronic devices is usually higher than $9 \times 10^{-6}$/K, e.g., between $11 \times 10^{-6}$/K and $20 \times 10^{-6}$/K. For example, the CTE of copper (e.g., C151) is $17.7 \times 10^{-6}$/K in the range between 293 K and 573 K. The CTE of insulators is usually lower, e.g., the CTE of $Al_2O_3$ is $5 \times 10^{-6}$/K to $9 \times 10^{-6}$/K. The CTE of semiconductors such as the widely used silicon is around $2.6 \times 10^{-6}$/K.

Hence, the method may comprise coating only in selective portions to avoid accumulation of stress over the entire device. For example, existing patterning technology can be used for selective coating of the metallic substrate (or primary lead frame).

Alternatively, or additionally, the method may comprise providing 531 an interlayer of material which buffers the different volumetric changes. Additionally, the adhesion between the insulating layer and the substrate can be improved by the presence of the interlayer. In some embodiments, the buffer interlayer can be provided on the assembled substrates.

In some embodiments of the present invention the interlayer is provided by molecular layer deposition (MLD) which allows providing a hybrid polymer. Such polymers have inorganic material linked by carbon chains. Cracking is reduced due to the elastic properties of these materials. In some embodiments of the present invention, the method comprises providing organic-inorganic hybrid polymer as interlayer. The method may comprise providing a metal-cone, for example comprising alucone but other hybrid polymers can be used, e.g., including transition metals, e.g., zirconium-based hybrid polymer (zircone). As MLD is similar to ALD, the same manufacturing setup could be used, simply changing reactants, thus providing first the hybrid polymer to the desired thickness and then providing the insulating layer.

Alternatively, it may be possible to provide material with a value of CTE adapted to buffer CTE mismatch between the insulating layer and the substrate over which said insulating layer is provided. The material is chosen so its value of CTE falls between the value of the CTE of the insulating layer and the value of the CTE of the substrate.

In some embodiments, the buffer interlayer comprises a hybrid organic-inorganic polymer (with elastic properties) with a value of CTE between the value of the substrate and the value of the inorganic layer. For example, alucone shows a CTE around 12, which combined with its elastic properties, makes it very suitable for buffer the CTE differences between metals typically used as lead frames, and alumina. For example, alucone may be provided between the primary lead and an alumina insulating layer.

The presence of this interlayer can serve to reduce stress which may be caused, among other reasons, if the sensor is subjected to large temperature changes during the manufacture and lifetime of the sensor.

The method may include providing 64 a packaged sensor, for example by covering the assembly with mold. Thus, the present invention allows providing a safe and durable device such as a packaged current sensor.

In a second aspect, the present invention provides a sensor, in particular a current sensor, comprising a first substrate including a sensing element, a second, conductive, substrate (e.g., a current carrier for probing a current), and an insulating layer between the first substrate and second substrate. The sensor may be provided by a manufacturing method in accordance with embodiments of the first aspect.

The insulating layer forms a barrier between the second substrate and other elements of the sensor, in particular sensitive elements such as the integrated electronics of the first semiconductor substrate. The layer protects these elements from discharges due to the proximity of the second substrate. The insulating layer is a conformal layer of insulating material which may include metal oxides (or nitrides, sulphides, etc. as explained earlier). In particular, materials such as zirconium oxide ($ZrO_2$) or alumina have a high $E_{BD}$ compared to polyimide or compounds thereof including glue. For example, zirconium oxide has a relative permittivity under 50 and a $E_{BD}$ above 4 MV/cm or even above 5 MV/cm, alumina provided by ALD reaches values of 5 MV/cm or above 5 MV/cm or even 10 MV/cm while polyimide is comparable to zirconium oxide, but tape (e.g. polyimide and glue) have a $E_{BD}$ of 0.15 MV/cm which is similar to usual mold compounds. For example, the insulating layer may comprise insulating material, e.g., material with a resistivity of e.g., $10^8$ Ω·cm or more, e.g., $10^{10}$ Ω·cm. For example, alumina can have a resistivity of the order of $10^{14}$ Ω·cm or above, e.g., $10^{15}$ Ω·cm. In some embodiments, materials with a high bandgap can be used, e.g., bandgaps of 5 eV or higher, e.g., 6 eV or higher.

Thus, it can be seen that insulation of a thin conformal layer of few microns of alumina, e.g., 15 microns, is comparable to the insulation provided by 54 microns of tape. A sensor in accordance with the present invention can be made very compact and, because the conductor which generates the magnetic field can be placed closer to the sensing element or elements, it is possible to increase sensitivity (for example, an increase of 33% compared to existing sensors).

For example, the insulating layer of embodiments of the present invention allows positioning the sensing element at distances closer to the primary conductor than with e.g., tape, for example 100 microns or less, e.g., within the range of 50 microns down to 1 micron. The material forming the barrier has a very high breakdown potential, so the thickness of the layer of material does not need to be large. This allows increasing also the sensitivity of the sensor as the sensor can be located closer to the primary conductor.

Figure 7:
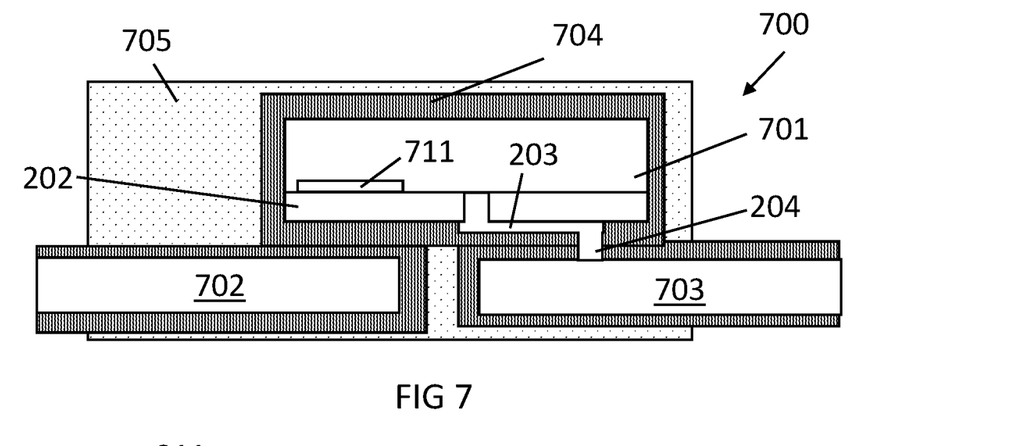
FIG. 7 shows an exemplary embodiment of a sensor in accordance with embodiments of the present invention where the insulating layer is provided on the leads and the chip of the sensor.

FIG. 7 shows a sensor in accordance with embodiments of the present invention. The sensor 700 includes at least one sensing element 711. In some embodiments, the sensing element 711 comprises at least one Hall effect-based sensing element, which provide a Hall measurement signal in presence of (and proportional to) magnetic field. The present invention is not limited to Hall effect-based sensing, and others are available. For example, the sensing element may comprise a magneto-resistive element.

The first substrate 701 includes the at least one sensing element 711. In embodiments of the present invention, the first substrate 701 may be a semiconductor substrate, for example a silicon die, although in embodiments of the present invention other semiconducting materials and compounds could be used. The semiconductor substrate may comprise a RDL 203, contacts 204 such as studs, ULBs or the like, a passivation layer 202 covering the sensing element 711 (although the sensing element could be provided over the passivation layer 202, while the insulating layer would still cover the sensing elements), as well as integrated circuitry, etc. thus forming a sensor chip, or simply chip. For example, the chip may be an ASIC chip.

The integrated sensor 700 further includes a second substrate 702 for carrying currents to be sensed, and a third substrate 703 for signal redirection and output, connected to the first substrate 701 which generates the measurement signals. The current-carrying substrate (the primary leads) may be included in the primary side of the sensor, while the microelectronics and the third substrate 703 may be included in the secondary side of the sensor.

In the embodiment of FIG. 7, the insulating layer 704 is a conformal layer of insulating material over the three substrates. In particular, the first substrate 701 is a semiconductor substrate completely covered by the insulating layer 704 except for the area taken by electrical connections, as shown in FIG. 7, but this is not limiting and the surfaces of the first substrate distal from the seconds substrate may present less or no insulating layer. Preferably, the conformal layer covers the gaps between substrates, so there is no region between substrates without interposed insulating material. Any required electric contact between substrates can be provided before insulating. Electric conductors can be also covered by insulating layer. For example, wires or bumps may be covered. FIG. 7 shows an embodiment where the integrated sensor has a flip-chip configuration. The studs 204 connecting the first substrate 701 and third substrate 703 may be covered by insulating material of the insulating layer.

For example, the sensor may include substrates covered by the insulating layer with gaps of around or less than 100 micrometers, for example between 10 and 20 microns, where the gaps may be filled by a material different from the material of the insulating layer however ensuring that the surfaces separated by these gaps are insulated. This is usually not possible with bulkier techniques such as vapor deposition or the like. The particular embodiment of FIG. 7 shows that the semiconductor substrate is completely covered by the insulating layer except for the area covered by the studs 204 connecting to the secondary leads 703. The secondary leads are also covered by the insulating layer in the area proximal to the primary frame, but not in the distal area, in order to provide electric contact to provide a signal output. In general, areas distal from the primary lead 702 could be uncovered by insulating layer, so they can provide electrical contacts.

The insulating layer 702 may comprise an oxide layer. In preferred embodiments, the insulating layer, e.g., the oxide, e.g., metal oxide, presents a high breakdown potential. The layer may have a thickness which can be tailored and optimized, taking into account the $E_{BD}$ of the material and the current through the first substrate. The present invention allows reducing the thickness to 100 microns or less, for example the layer may have a thickness between 10 microns and 20 microns, e.g., 15 microns, also allowing the distance between the second and first substrates to be reduced, improving sensitivity as mentioned earlier.

The first substrate and part of the second and third substrates, may be covered by a mold 705 thus forming a packaged product. The method outlined in FIG. 6 could be used to provide the packaged product of FIG. 7.

Figure 8:
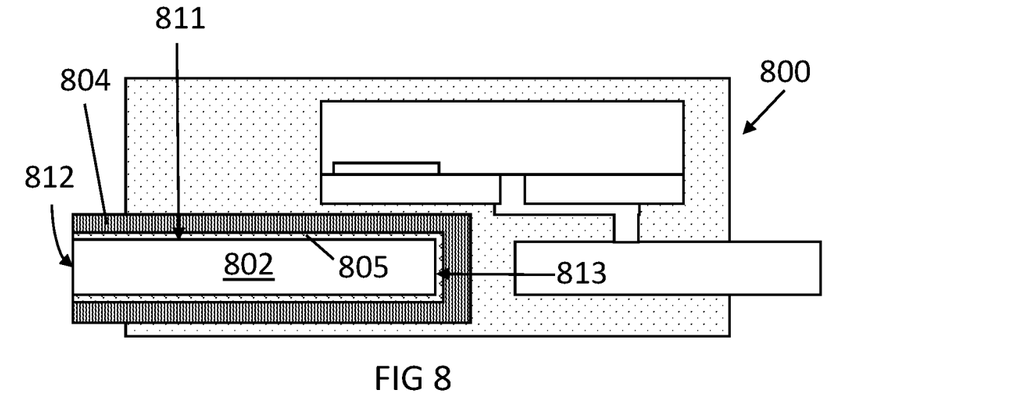
FIG. 8 shows an exemplary embodiment of a sensor in accordance with embodiments of the present invention where the insulating layer is provided on the primary lead for probing current, further including a flexible interlayer for buffering any difference of expansion coefficients between the lead and the insulating layer in case of exposure to temperature changes.

In some embodiments, only one substrate or only the first and second substrates may be (at least partially) covered by the conformal insulating layer provided by ALD in the sensor. These sensors may be provided, for example, following the methods explained with reference to FIG. 5. For example, FIG. 8 shows an embodiment of the sensor 800 where only the primary leads 802 are covered conformally by an insulating layer 804. The leads may be covered except on the regions that require electrical contact and that are distal from the sensing element, so that there is no risk of discharge between the primary leads and other parts of the sensor. The embodiment of FIG. 8 shows the primary leads covered by the insulating layer 804 except in the region 812 to be in contact with the line through which the current should be probed. Said embodiment also shows a conformal interlayer 805 sandwiched between the insulating layer 804 and the substrate 802. The interlayer 805 has the function of a buffer stress to a large extent, due for example but not exclusively to the difference in values of the CTE of the insulating layer and the substrate. As explained earlier, in some embodiments said layer may have elastic properties, e.g., it is a metalcone such as alucone.

Alternatively, only some of the surfaces may be covered by insulating layer, for example the back of the substrate may have no insulating layer. This is show for example in the insulated first substrate 300 obtained by the method outlined with reference to FIG. 4.

Figure 9:
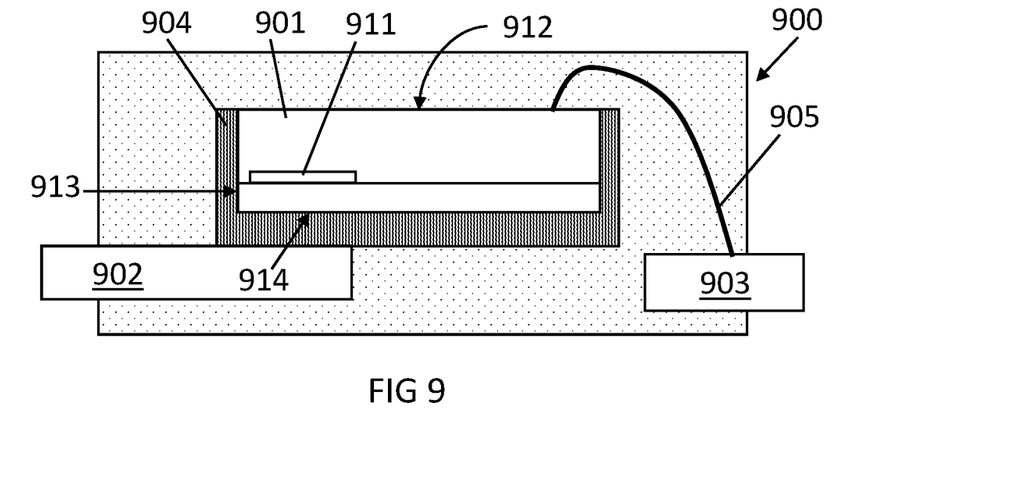
FIG. 9 shows an exemplary embodiment of a sensor in accordance with embodiments of the present invention where the insulating layer is provided on the chip of the packaged sensor.

The sensor 900 of FIG. 9 includes a first substrate 901 partially covered by a conformal insulating layer 904. The sensing element 911 is proximal to the second substrate 902 and, depending on the $E_{BD}$ of the material and the thickness of the layer, the distance can be optimized to obtain a high sensitivity. However, the surface 912 of the first substrate facing away the second substrate 902 does not need to include insulating layer. In some embodiments, parts of this surface can be used to provide electrical contacts to the third substrate 903, e.g., wires 905 if the sensor include wire-bond interconnections.

The interlayer 805 shown in FIG. 8 may be present between the insulating layer and any other underlying substrate, so it could be applied to for example the embodiment of FIG. 7 or FIG. 9. Additionally, or alternatively, the interlayer 805 may be selected to improve attachment to the substrate, for example.

In some embodiments of the present invention, the conformal layer 302, 704, 804, 904 covers more than one surface, thus improving the insulation, for example at least two non-coplanar surfaces of a substrate, for example at least two non-coplanar adjacent surfaces, e.g. at least two perpendicular surfaces 811, 813, 913,914, of the first substrate 802 and/or the second substrate 901 (as shown by the arrows of FIG. 8 and FIG. 9). Since the insulation 'turns edges' of the substrate, it at least partially wraps the substrate, and the electric path is increased, thus improving isolation over e.g., a planar layer provided only over a surface or only between two surfaces.

In summary, sensors in accordance with embodiments of the present invention, such as sensors provided by the method of manufacture of the present invention, provide good insulation between the primary side (which carries potentially dangerous signals) and the secondary side of the sensor (which may include delicate electronics and secondary leads to a signal output). This is done by providing a self-limiting deposition of insulating material, by layer deposition (for example ALD), such as metal oxide, which conformally covers the substrate holding the electronics and/or the substrate carrying the probe currents, for example in trenches therebetween, with a relatively thin and homogeneous layer deposited thereon, rather than attached thereon.

The invention claimed is:

1. A method of manufacture of a current sensor for sensing a magnetic field generated by a current in a conductive substrate, the method comprising
providing a first substrate comprising a sensing element for sensing magnetic field,
providing a second substrate being the conductive substrate, the second substrate being connectable to a line for carrying a current to be measured,
providing by atomic layer deposition an insulating layer between the first substrate and the second substrate.

2. The method of claim 1, wherein providing an insulating layer comprises providing a conformal insulating layer.

3. The method of claim 1, wherein providing an insulating layer comprises providing a metal oxide by deposition, optionally wherein the metal oxide is aluminum oxide.

4. The method of claim 1, wherein providing an insulating layer by atomic layer deposition comprises depositing an insulating layer over the first substrate or the second substrate.

5. The method of claim 4, wherein providing a first and second substrate comprises providing at least one substrate with at least two non-coplanar adjacent surfaces, and wherein providing an insulating layer comprises providing an insulating layer over the at least one substrate on said at least two non-coplanar adjacent surfaces.

6. The method of claim 1, further comprising assembling the first and second substrates thereby providing a package before providing the insulating layer by atomic layer deposition, subsequently depositing the insulating layer by atomic layer deposition over both substrates and subsequently molding the package thereby forming a molded package.

7. The method of claim 4, further comprising providing a buffer interlayer for buffering stress between the insulating layer and the first substrate or the second substrate.

8. The method of claim 7, wherein providing a buffer interlayer comprises providing an organic-inorganic hybrid polymer by molecular layer deposition.

9. The method of claim 1, wherein providing the insulating layer by atomic layer deposition comprises providing spatial atomic layer deposition.

10. A sensor comprising
a first substrate comprising a sensing element,
a second substrate being a conductive substrate adapted to generate a measurable magnetic field upon connecting the second substrate to a current flow, the second substrate being connectable to a line for carrying a current flow to be measured,
where the sensing element is arranged to sense a magnetic field generated by the second substrate,
and further comprising a conformal insulating layer between the first substrate and the second substrate.

11. The sensor of claim 10, wherein the insulating layer has a thickness between 1 micron and 100 microns.

12. The sensor of claim 10, wherein the insulating layer comprises a metal oxide.

13. The sensor of claim 10, wherein the insulating layer is provided at least on the first and second substrates.

14. The sensor of claim 10, wherein the insulating layer is provided at least on the first or on the second substrate, the sensor further comprising a buffer interlayer between the insulating layer and at least the first or the second substrate, for buffering stress between the insulating layer and the first or the second substrate.

15. The sensor of claim 10, further comprising
a third substrate electrically connected to the first substrate, for redirecting
measurement signals generated by the sensing element to an external output, further comprising an insulating layer between the third substrate and at least second substrate.

* * * * *